United States Patent [19]

Ishida

[11] Patent Number: 4,476,586
[45] Date of Patent: Oct. 9, 1984

[54] IF SIGNAL PROCESSING CIRCUIT IN A RECEIVER

[75] Inventor: Koji Ishida, Tokyo, Japan

[73] Assignee: Pioneer Electronic Corporation, Tokyo, Japan

[21] Appl. No.: 464,167

[22] Filed: Feb. 7, 1983

[30] Foreign Application Priority Data

Feb. 5, 1982 [JP] Japan .................................. 57-17931
Feb. 18, 1982 [JP] Japan .................................. 57-24694
Feb. 18, 1982 [JP] Japan .................................. 57-24695

[51] Int. Cl.³ .......................................... H04B 1/26
[52] U.S. Cl. .................. 455/207; 455/209; 455/315; 455/311
[58] Field of Search ............. 455/205, 207–209, 455/311, 314, 315, 316

[56] References Cited

U.S. PATENT DOCUMENTS 2,510,906  6/1950  Reid .................................... 455/207
3,361,976  1/1968  Konian ................................ 455/315
3,505,607  4/1970  Van Gerwen et al. ............. 455/314
3,544,899  12/1970  Gusyatinsky ....................... 455/207

Primary Examiner—Jin F. Ng
Attorney, Agent, or Firm—Sughrue, Mion, Zinn, Macpeak & Seas

[57] ABSTRACT

In an IF signal processing circuit in an FM receiver, distortion introduced by an IF filter is eliminated without degrading a selection characteristic thereof. The circuit includes a front end which converts an FM-RF signal into a first IF signal; an IF filter; an FM detector which detects the first IF signal which has passed through the IF filter; an FM modulation circuit which outputs an FM modulation signal in accordance with a detection output of the FM detector; a mixer for mixing the FM modulation signal with the first IF signal and providing a second IF signal; and another mixer for mixing the second IF signal with the FM modulation signal to convert into the first IF signal. The first IF signal thus converted is delivered to an FM detector.

8 Claims, 6 Drawing Figures

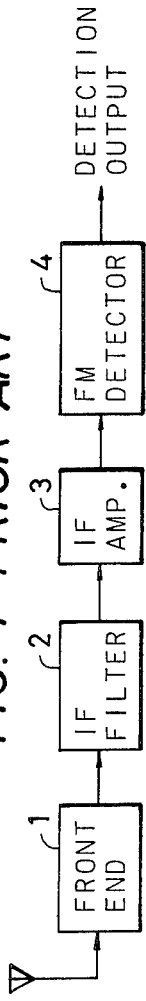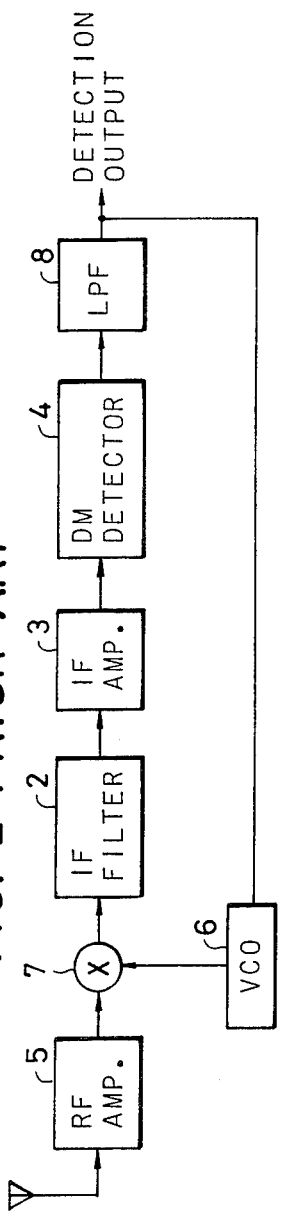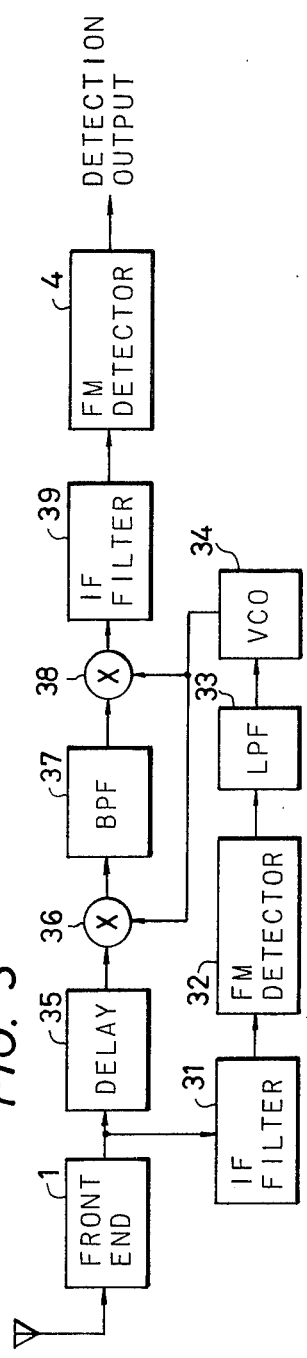

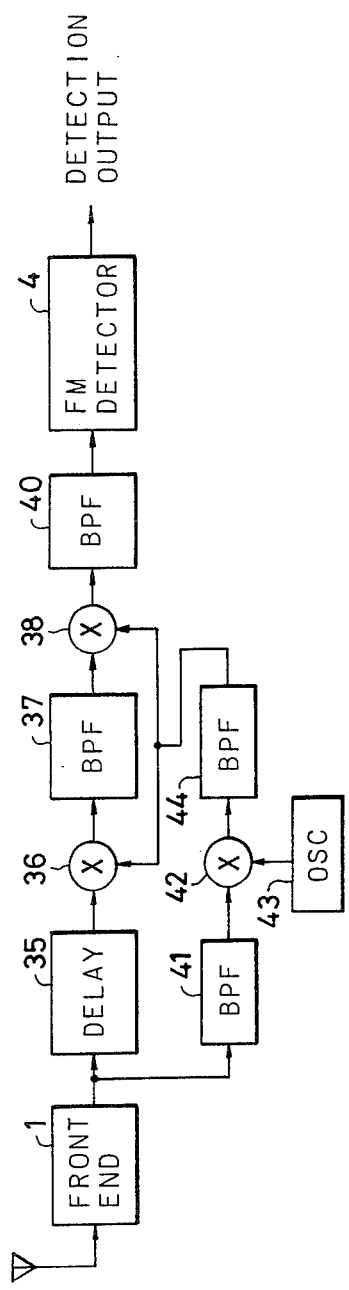
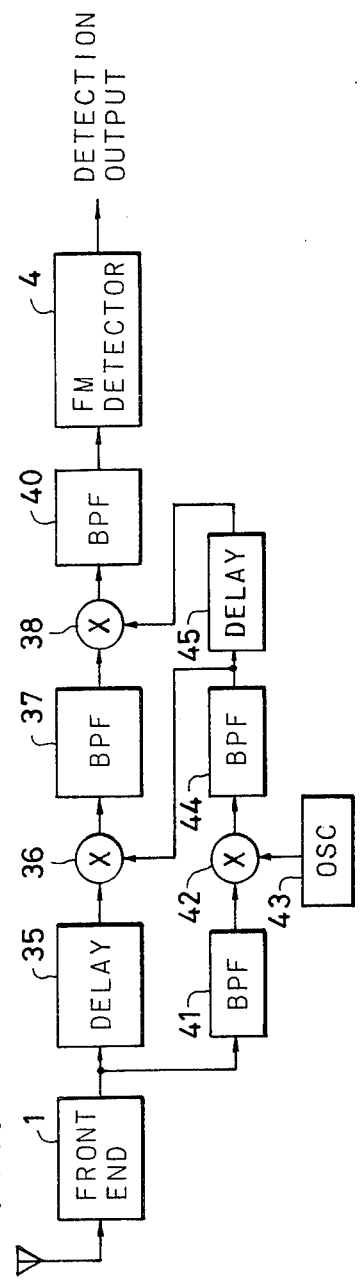

IF SIGNAL PROCESSING CIRCUIT IN A RECEIVER

BACKGROUND OF THE INVENTION

The present invention relates to an intermediate frequency signal processing circuit which eliminates distortion introduced by an IF (intermediate frequency) filter provided in an IF amplifying stage of an FM receiver.

A block diagram shown in FIG. 1 illustrates an IF signal processing stage. An IF signal outputted from a front end 1 is applied through an IF filter 2 to an IF amplifier 3. An output amplified in the IF amplifier 3 is detected in an FM detector 4. The IF filter 2 is required to have both a selection characteristic and a low-distortion characteristic so as to exclude an interfering signal. A Bessel-type IF filter which has precise amplitude characteristic and phase characteristic is suitable for use in the IF filter. However, the Bessel-type IF filter is not satisfactory because the improvement in the characteristic thereof is limited and thus the required characteristics are not perfectly met. In view of such a circumstance, it has been difficult to reduce distortion introduced by the IF filter.

FIG. 2 shows an FM negative feedback type IF signal processing circuit which has been practically used to improve the characteristic of the circuit shown in FIG. 1. An RF (radio frequency) signal outputted from an RF amplifier 5 is mixed with an output of a VCO (voltage-controlled oscillator) 6 in a mixer 7 and is converted into an IF signal. The latter signal is applied through the IF filter 2, the IF amplifier 3, and the FM detector 4 to an LPF (low-pass filter) 8. The output of the LPF 8 is fed back to the VCO 6 as a control signal to control the oscillation frequency of the VCO 6. The FM detection output is frequency modulated by means of the VCO 6 and is then fed as a mixing input to the mixer 7.

With a circuit thus arranged, the frequency deviation (±75 KHz) of the RF signal is compressed, for example, to ±7.5 KHz by the mixture with the output of the VCO 6, whereby the bandpass range of the IF signal is made narrow. As a result, the apparent bandpass range of the IF signal is extended when compared with the circuit shown in FIG. 1, and thus distortion is reduced.

However, such an FM negative feedback system is disadvantageous in that compression of the frequency deviation adversely lowers the detection efficiency, and selectivity is degraded due to simultaneous compression of a disturbing signal. Furthermore, the circuit becomes unstable and thus oscillation is liable to occur because of the use of the negative feedback system.

SUMMARY OF THE INVENTION

An object of the present invention is to provide an IF signal processing circuit in which distortion introduced by an IF filter is eliminated without degrading a selection characteristic thereof.

The IF signal processing circuit according to the invention includes means for converting an FM-RF signal into a first IF signal; means for detecting the first IF signal which has passed through a band-pass filter and providing a detection output; FM modulation means for providing an FM modulation signal in accordance with the detection output; means for mixing the FM modulation signal with the first IF signal to obtain a second IF signal; and means for mixing the second IF signal with the FM modulation signal to convert into the first IF signal and means for delivering the first IF signal thus converted to an FM detector.

BRIEF DESCRIPTION OF THE DRAWINGS

In the drawings:
FIGS. 1 and 2 are block diagrams showing prior art IF signal processing circuits of an FM receiver; and
FIGS. 3 through 6 are block diagrams showing IF signal processing circuits of an FM receiver according to various embodiments of the invention.

DETAILED DESCRIPTION OF THE PREFERRED EMBODIMENTS

Figure 6:
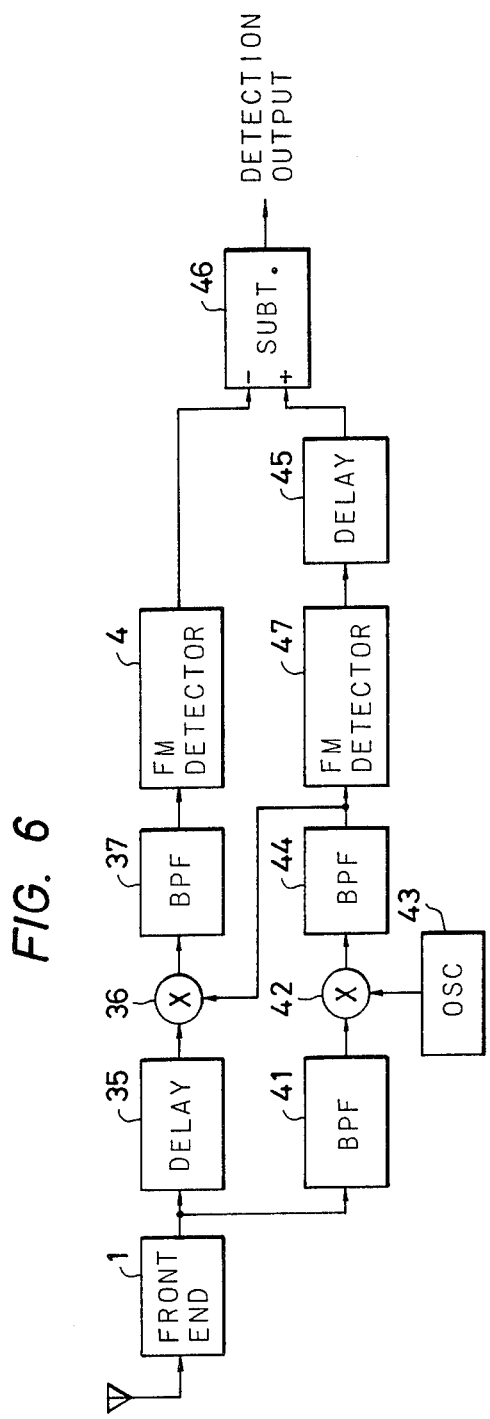

For a better understanding of the features and operational effects attained by the present invention, the present invention will now be described by way of its preferred embodiments with reference to the accompanying drawings.

FIG. 3 is a block diagram illustrating a first embodiment of the invention. In the figure, a first IF signal (10.7 MHz) fed from a front end 1 is applied to an IF filter 31 where an interference signal is removed and is fed to an FM detector 32 where the IF signal is FM detected, whereat transmission distortion occurs when passing through the IF filter 31 and the FM detector 32. The band-pass range of the detected output is restricted by an LPF 33, and an output of which is next applied, as a control signal, to a VCO 34. In the case of a so-called pilot tone FM broadcasting wave, the LPF 33 may be designed to pass-up to a signal of 53 KHz which is the upper limit frequency of a sub-signal. The detected output by the VCO 34 again becomes the FM signal, whereat the frequency of the FM signal is modulated in accordance with the detected output with a central frequency of 6.2 MHz which is a free-running oscillation frequency of the VCO 34. The spectrum of the FM signal provided by the VCO 34 contains an (S+D) component where the original modulation signal is S and distortion introduced by a transmission line composed of the IF filter 31, the detector 32, the LPF 33 and the VCO 34.

On the other hand, the first IF signal (10.7 MHz) fed from the front end 1 is applied through a delay circuit 35 which serves to correct a delay time caused by the transmission line composed of the IF filter 31, the FM detector 32, the LPF 33 and the VCO 34, to a mixer 36 where the FM signal (6.2 MHz) which is the output of the VCO 34 is mixed with the first IF signal. From the mixture signal, a second IF signal component is extracted (10.7−6.2=4.5 MHz) by means of a BPF (bandpass filter) 37. In this case, the first IF signal (10.7 MHz) which is one of the input signals applied to the mixer 36 contains only the S component because the first IF signal is not delivered through BPS or the like causing to introduce distortion. Therefore, only the distortion component D, i.e. (S+D)−S=D, is present in the second IF signal (4.5 MHz) produced from the BPF 37. The second IF signal containing only the distortion component D has less frequency deviation, so that no distortion is introduced even if the interfering component is removed by the BPF 37 of a narrow band-pass range.

The second IF signal (4.5 MHz) fed from the BPF 37 is mixed with the output signal (6.2 MHz) of the VCO 34 in a mixer 38, and the first IF signal (10.7 MHz) is again obtained in an IF filter 39, the output of which is in turn applied to an FM detector 4. From the conversion output in the mixer 38, the component of S, i.e. (S+D)−D=S, is derived, hence the distortion component D is removed and only the spectrum of modulation signal S remains. Therefore, a wide band-pass filter which does not introduce distortion can be used for the IF filter 39.

With a circuit thus arranged, it becomes possible to improve the selection characteristic of the BPF 31 used as the IF filter and to cancel the signal distortion introduced from such a filter, so that characteristic of the IF signal processing circuit is improved. The circuit according to the invention is particularly advantageous in that since the negative feedback is not employed, there is no danger that the circuit oscillates. That is, the circuit can be placed in stabilized condition. Furthermore, by the provision of the LPF 33 between the FM detector and the VCO 34 it is possible to control the bandpass range needed to improve distortion. If the output of the VCO 34 is controlled by adjusting the sensitivity of the same so as to be the same frequency deviation (±7.5 KHz) as that of the first IF signal outputted from the front end, the second IF signal is capable of extracting only the distortion component D.

The delay circuit 35 can be omitted if the signal delay caused by the transmission line composed of the filter 31, the FM detector 32, the LPF 33 and the VCO 34 is negligible. Further, a HPF (high-pass filter) can be employed in the filter 39 if the mixer 38 is an ideal multiplier. Since the LPF determines the frequency range to correct distortion, it can be omitted if the frequency characteristic of the FM detector 32 can be appropriately set. Furthermore, the output frequency deviation of the VCO can be made smaller relative to that of the first IF signal. In such a case, the improvement of distortion is correspondingly lowered. The numeral values as mentioned hereinabove are only examples, and the present invention is not limited thereto.

A second embodiment according to the invention will be described with reference to FIG. 4.

The first IF signal (10.7 MHz) fed from the front end 1 is applied to a first IF band-pass filter (BPF) 41 where the interfering signal is removed, whereat transmission distortion is introduced into the FM signal when passing through the BPF 41. The output of the BPF 41 is applied to a first mixer 42 where it is subjected to frequency conversion by a signal of 4.5 MHz produced from a local oscillator (OSC) 43, and applied to the first mixer 42. The signal thus frequency converted is passed through a second BPF 44 and a signal of 6.2 MHz is obtained therefrom. The second BPF 44 is designed to have a winder band range in comparison with the first BPF 41. Therefore, transmission distortion is scarcely introduced by the second BPF 44. The spectrum of the modulation signal of the FM wave which has been subjected to frequency conversion in the first mixer 42 contains an (S+D) component where S and D are the original signal modulation signal and distortion introduced by the first and second BPFs 41 and 44, respectively.

On the other hand, the first IF signal (10.7 MHz) which has passed through the delay circuit 35 does not contain distortion but only the modulation signal S appears in the output of the delay circuit 35. The delay circuit 35 serves to correct the delay time caused by the first and second BPFs 41 and 44. The first IF signal (10.7 MHz) which has passed through the delay circuit 35 is subjected in a second mixer 36 to frequency conversion by a signal of 6.2 MHz which is obtained from the second BPF 44, and a second IF signal of 4.5 MHz is obtained from the second mixer 38. At this time, the second IF signal contains only the distortion component D as a result of processing represented by (S+D)−S=D, thus the amount of frequency deviation is relatively small. The third BPF 37 is used to remove the interfering wave by having its band-pass range narrow. The third BPF 37 scarcely introduce distortion due to the fact that the frequency deviation thereof is small. The second IF signal again becomes the first IF signal (10.7 MHz) in the third mixer 38 by the application of the signal outputted from tne second BPF 44 to the third mixer 38. From the output of the third mixer 38, the component of S obtained by the processing of (S+D)−D=S, is derived, where distortion component D is removed and only the modulation signal S is contained. A wide band-pass filter which does not introduce distortion is usable as the fourth BPF 4. A lower distortion characteristic is obtained without degrading the selection characteristic by detecting in the FM detector 4 the signal which has passed through the fourth BPF 40.

FIG. 5 is a block diagram showing the third embodiment of the invention in which a delay circuit 45 is intervened between the second BPF 44 and the third mixer 38. By the provision of the delay circuit 42, further reduction of the distortion component is attained by cancelling the delay time caused by the third BPF 38.

In the above description relating to the second and third embodiments of the invention, although the delay circuit 35 is provided to correct the delay time caused by the first and second BPFs 41 and 44, it can be omitted when the delay time is substantially negligible. Further, the first and second IF signals can be set to other frequencies, at this time, the oscillation frequency of the local oscillator 43 must be set to a lower frequency than the first IF frequency. A high-pass filter (HPF) is usable for the BPS 40 if the third mixer 38 is an ideal multiplier. Although it has been described that the first BPF 41 is provided with the selection characteristic, it may be possible to impart the similar characteristic to the second BPF 44. In this case, the first BPF 41 can be simplified or can be omitted.

As describled, in accordance with the second and third embodiments of the invention, it is capable of improving the characteristic of the IF signal processing circuit, since the signal distortion caused by the BPFs 41 and 44 can be cancelled while improving the selection characteristics thereof. Since the circuits in accordance with the second and third embodiments are not of the negative feedback structure, there is no danger that the oscillation occurs and therefore it is possible to use the circuit under stabilized condition. In the circuit of the type employing the negative feedback, a pulse count detection which is a linear detection has not been available due to a time constant of its associated integration circuit. However, according to the invention, such a pulse count detection is available. Furthermore, since the VCO is not used in the second and third embodiments of the invention, distortion or unwanted noises introduced by the VCO is not present, and thus excellent quality of detection output is obtainable.

The fourth embodiment of the invention will next be described with reference to FIG. 6. The fourth embodiment is similar to the third embodiment with the exception of the following. That is, in the fourth embodiment, the output of the LPF (BPF) 44 is applied to a first FM detector 44, and the output the first FM detector 47 is applied through a delay circuit 45 to a non-inverting input of a subtractor 46. On the other hand, the output of a second FM detector 4 disposed in the output of the BPF 37 is applied to an inverting input of the subtractor 46 where subtraction of $(S+D)-D=S$ is carried out, thereby providing the component S. In this manner, distortion-free detection output is obtained from the subtractor 46. The delay circuit 45 is provided to correct the delay time caused by the first BPF 37.

In the fourth embodiment, various modifications are possible. For example, the delay circuit 45 can be disposed in the front stage of the FM detector 44. In this case, a high frequency delay line is used for the delay circuit 45.

The fourth embodiment implements cancelling of distortion with a so-called feed forward system, whereby there is not danger that oscillation occurs and therefore the circuit is operated under a stabilized condition. Furthermore, the delay time caused by the band-pass filter is corrected by the delay circuit when distortion is cancelled, therefore, there is very little cancellation error caused by the time difference. Cancellation of distortion is implemented in the audio frequency band range, the circuit can be arranged simply.

What is claimed is:

1. An IF signal processing circuit in an FM receiver comprising: means for converting a reception signal being frequency modulated into a first IF signal; a band-pass filter connected to an output of said converting means; means for detecting an output of said band-pass filter and providing a detection output; modulation means coupled to said detecting means for providing a frequency modulation signal in accordance with said detection output; means for producing a second IF signal upon mixture of said frequency modulation signal with said first IF signal; means for mixing said frequency modulation signal with said second IF signal to provide a mixed signal having the same frequency as said first IF signal; and an FM detector for receiving said mixed signal.

2. The IF signal processing circuit as claimed in claim 1, wherein said modulation means comprises a low-pass filter and a voltage-controlled oscillator, an oscillation frequency of said voltage-controlled oscillator being controlled in response to an output of said low-pass filter.

3. The IF signal processing circuit as claimed in claim 1, further comprising means for delaying said first IF signal connected between said converting means and said second IF signal producing means.

4. An IF signal processing circuit in an FM receiver comprising: means for converting a reception signal being frequency modulated into a first IF signal; a first band-pass filter connected to an output of said converting means; means coupled to said first band-pass filter for frequency converting an output of said first band-pass filter and providing a frequency modulation signal; means for producing a second IF signal upon mixture of said frequency modulation signal with said first IF signal; a second band-pass filter receiving in its input said second IF signal; means for mixing said frequency modulation signal with an output of said second band-pass filter to provide a mixed signal having the same frequency as said first IF signal; and means for delivering said mixed signal to an FM detector.

5. The IF signal processing circuit as claimed in claim 4, further comprising first delaying means for delaying said first IF signal, said first delaying means being connected between said converting means and said second IF signal producing means.

6. The IF signal processing circuit as claimed in claim 5, further comprising a third band-pass filter connected between said frequency converting means and said second IF signal producing means.

7. The IF signal processing circuit as claimed in claim 6, further comprising second delaying means for delaying an output of said third band-pass filter, said second delaying means being connected between said third band-pass filter and said mixing means.

8. An IF signal processing circuit in an FM receiver comprising: means for converting a reception signal being frequency modulated into a first IF signal; a first band-pass filter connected to an output of said converting means; means for frequency converting an output of said first band-pass filter and providing a frequency modulation signal; means for providing a first detection signal upon detection of said frequency modulation signal; means for mixing said frequency modulation signal with said first IF signal and providing a second IF signal; a second band-pass filter receiving in its input said second IF signal; means for detecting an output of said second band-pass filter and providing a second detection output; and means for subtracting said second detection output from said first detection output.

* * * * *